(12) United States Patent
Makuth et al.

(10) Patent No.: US 9,664,720 B2
(45) Date of Patent: May 30, 2017

(54) DEVICE FOR THE CONTACTLESS DETERMINATION OF AN ELECTRICAL POTENTIAL OF AN OBJECT, CURRENT PROBE, AND METHOD

(75) Inventors: Jens Makuth, Feucht (DE); Dirk Scheibner, Nürnberg (DE); Jürgen Schimmer, Nürnberg (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 588 days.

(21) Appl. No.: 14/111,642

(22) PCT Filed: Apr. 14, 2011

(86) PCT No.: PCT/EP2011/055950
§ 371 (c)(1),
(2), (4) Date: Dec. 17, 2013

(87) PCT Pub. No.: WO2012/139650
PCT Pub. Date: Oct. 18, 2012

(65) Prior Publication Data
US 2014/0145730 A1    May 29, 2014

(51) Int. Cl.
*G01R 27/26*  (2006.01)
*G01R 29/12*  (2006.01)

(52) U.S. Cl.
CPC .......... *G01R 27/2611* (2013.01); *G01R 29/12* (2013.01)

(58) Field of Classification Search
None
See application file for complete search history.

(56) References Cited

U.S. PATENT DOCUMENTS

| | | | |
|---|---|---|---|
| 4,267,511 A | * | 5/1981 | Suzuki ............... G03G 15/5037 324/458 |
| 4,611,207 A | | 9/1986 | Anderson et al. |
| 4,613,228 A | * | 9/1986 | Suzuki ................... G01R 29/12 324/452 |

(Continued)

FOREIGN PATENT DOCUMENTS

| | | |
|---|---|---|
| CN | 1229474 | 9/1999 |
| CN | 1910461 | 2/2007 |

(Continued)

OTHER PUBLICATIONS

German language translation of Japanese Office Action for related Japanese Patent Application No. 2014-504178, issued Apr. 13, 2015, 19 pages.

(Continued)

*Primary Examiner* — Patrick Assouad
*Assistant Examiner* — Douglas X Rodriguez
(74) *Attorney, Agent, or Firm* — Henry M. Feiereisen LLC

(57) ABSTRACT

A device for the contactless determination of an electrical potential of an object, has an electrode and a potential controller which is electrically connected to the electrode. The potential controller changes a reference potential applied to the electrode to a final value in such a way that an electric field between the object and the electrode disappears at the final value if the electrode is located at a distance from the object. The electrical potential is determined from the final value.

9 Claims, 3 Drawing Sheets

(56) References Cited

U.S. PATENT DOCUMENTS

| | | | | |
|---|---|---|---|---|
| 4,614,908 | A | * | 9/1986 | Daniele .............. G01R 5/28 324/457 |
| 5,151,659 | A | * | 9/1992 | Tanaka .............. G01N 27/60 324/457 |
| 5,473,244 | A | | 12/1995 | Libove et al. |
| 6,531,880 | B1 | | 3/2003 | Schneider et al. |
| 7,098,644 | B1 | * | 8/2006 | Denison .............. G01R 29/12 324/458 |
| 7,397,233 | B2 | | 7/2008 | Sorensen |
| 8,054,061 | B2 | | 11/2011 | Prance et al. |
| 2006/0058694 | A1 | | 3/2006 | Clark et al. |
| 2007/0086130 | A1 | | 4/2007 | Sorensen |
| 2007/0164723 | A1 | | 7/2007 | Yanagisawa |
| 2011/0062968 | A1 | * | 3/2011 | Renno .............. G01R 29/12 324/654 |
| 2011/0148393 | A1 | | 6/2011 | de Buda |

FOREIGN PATENT DOCUMENTS

| | | |
|---|---|---|
| CN | 101490564 | 7/2009 |
| DE | 4123309 | 1/1993 |
| EP | 0398396 | 11/1990 |
| EP | 1249706 | 10/2002 |
| FR | 2924814 | 6/2009 |
| JP | 54-36980 | 3/1979 |
| JP | 06-242166 | 9/1994 |
| JP | 2009-41925 | 2/2009 |
| WO | 2008/009906 | 1/2008 |
| WO | PCT/EP2011/055950 | 4/2011 |

OTHER PUBLICATIONS

German language translation of Japanese Office Action for related Japanese Patent Application No. 2014-504178, issued Jul. 16, 2015, 4 pages.

R. J. Prance et al., "Non-contact VLSI imaging using a scanning electric potential microscope," Measurement Science and Technology, vol. 9, No. 8, 1998, pp. 1229-1235.

English language International Search Report for PCT/EP2011/055950, mailed Dec. 28, 2011, 4 pages.

German Translation of Office Action mailed Dec. 8, 2014 for corresponding Japanese Patent Application No. 2014-504178.

Japanese Office Action for related Japanese Patent Application No. 2014-504178, issued Nov. 24, 2015, 2 pages.

Chinese Office Action for related Chinese Patent Application No. 201180070121.8, issued Dec. 23, 2014, 15 pages (including partial English and German translations).

* cited by examiner

DEVICE FOR THE CONTACTLESS DETERMINATION OF AN ELECTRICAL POTENTIAL OF AN OBJECT, CURRENT PROBE, AND METHOD

CROSS REFERENCE TO RELATED APPLICATIONS

This application is based on and hereby claims priority to International Application No. PCT/EP2011/055950 filed on Apr. 14, 2011, the contents of which are hereby incorporated by reference.

BACKGROUND

The invention relates to a device for the contactless determination of an electrical potential of an object comprising an electrode. The invention also relates to a current probe with such a device. Finally, the invention relates to a method for the contactless determination of an electrical potential of an object.

It is known to measure the current flow through an object in contactless fashion. This can be performed via inductive coupling, the Hall effect or the GMR (giant magnetoresistance) effect. In order to be able to measure electrical power in contactless fashion, however, a method for the contactless potential measurement is also required, in addition to contactless current measurement. The contactless potential measurement, in particular of high voltages, is of particular importance primarily in the sector of smart metering, smart grid and demand response strategies.

One possibility for this is provided by so-called electric field meters. These use the effect of electrostatic induction in order to be able to draw conclusions on the voltage to be determined via the determined electric field strength. However, for this, the distance between the object whose potential is intended to be determined and the measuring electrode of the electric field meter and material (dielectric) between the measuring electrode and the object in the measurement capacitance need to be known precisely. In order to be able to measure DC voltages as well with an electric field meter, in general a shutter (field stop) in the form of a chopper (impeller) is used between the measuring electrode and the object.

In order to determine purely AC voltages, capacitive voltage dividers can also be used, wherein in this case the coupling capacitance between a reference electrode and the potential to be measured likewise needs to be known.

Both methods and devices (electric field meter and capacitive voltage divider) presuppose precise knowledge of the coupling to the voltage to be measured, in particular of the distance between the measuring electrode and the measurement object. To this extent, these known methods are unsuitable for only temporary measurement operations or retrospective measurement installations. Electric field meters and capacitive voltage dividers are installed permanently for precise measurements and calibrated in the installed environment. In the case of handheld measuring devices, precise knowledge of the geometry and material makeup (line insulation, air, gas, condensation, etc.) of the measurement setup is necessary. For this, for example, special spacers are used in conventional electric field meters. However, spacers have the disadvantage that they do not rest directly on the conductive material, in particular for the potential determination of electrically insulated lines, and therefore only insufficiently accurately set the distance. In addition, the type of insulating material cannot be taken into consideration. If this precision of the known contactless potential measurement methods is insufficient, it is generally necessary for the measurements to be taken in contact-making fashion.

EP 1 249 706 A2 describes a contactless voltage measurement method for measuring an AC voltage applied to a conductor using a detection probe comprising a detection electrode, which can cover some of a surface of insulation for insulating the conductor, and a shielding electrode for covering the detection electrode, and an oscillator for outputting a signal, wherein in each case one end of a core cable and a sheath cable of a shielded cable is connected to the detection electrode and to the shielding electrode, respectively, and wherein the influence of a potential-free capacitance is substantially eliminated by the production of an imaginary short-circuit state between the respective other ends of the core cable and the sheath cable.

WO 2008/009906 A1 describes a sensor for determining an electrical potential comprising at least one detection electrode, which is arranged for capacitive coupling to a probe in the test and for generating a measurement signal, an oscillator, which is arranged for generating an oscillator output which has a frequency corresponding to the frequency of the measurement signal, and a feedback device, which reacts to the oscillator output in order to generate a feedback reference signal in order to apply coherent feedback at the input of the sensor amplifier.

US 2006/058694 A1 discloses an electrodynamic sensor comprising a pair of input probes for detecting electrical potentials which originate from an object to be tested and for generating detection signals. In addition, the sensor comprises an electric meter, which has an amplifier and is designed to receive the detection signals and produce measurement signals.

U.S. Pat. No. 6,531,880 B1 describes a contactless cable tester comprising a sensor for detecting an electrical field, which is output by a cable. In this case, the sensor signal is compared with predetermined threshold values in order to determine the electrical energy flowing through the cable.

Furthermore, US 2007/086130 A1 describes a device for determining an AC voltage in a conductor comprising a first and a second group of capacitive voltage sensors, which are each arranged in the form of a circle around the conductor.

U.S. Pat. No. 5,473,244 A discloses a device for the contactless measurement of the voltage, the current and the power in an electrical conductor. The device comprises an arrangement comprising capacitive sensors, with which a sensor signal can be provided depending on the electrical field generated by the electrical conductor. In this case, a DC voltage can also be detected in the electrical conductor by virtue of an electrode of the capacitive sensors being moved continuously.

FR 2 924 814 A and EP 0 398 396 A2 describe systems for measuring electrical voltages. Said systems comprise capacitive sensors with which the electrical voltages in a polyphase system can be detected.

U.S. Pat. No. 4,611,207 A discloses a device for measuring an electrical voltage, which has a ring-shaped housing, which can be arranged on a high-voltage overhead line.

SUMMARY

One potential object is providing a method and a device with which contactless potential measurement is possible even when the coupling capacitance is initially unknown.

The inventors propose a device for the contactless determination of an electrical potential of an object and comprises an electrode and a potentiometer, which is electrically connected to the electrode for changing a reference potential present at the electrode to an end value, at which a charge-reversal current flowing between the electrode and a reference potential carrier disappears when the electrode is spaced apart from the object, and for determining the electrical potential of the object from the end value, and a device for periodically changing an arrangement of a field stop, which is arranged between the object and the electrode, so that, at first times, an electrical field is formed between the electrode and the object and, at second times, the electrical field is shielded by the field stop, wherein the potentiometer can be used to determine a temporally constant electrical potential of the object.

With knowledge of the end value during measurement of the disappearance of the electrical field it is possible to draw a direct conclusion on the electrical potential to be determined. In this way, a compensation method is provided, in which the electrode is raised in particular to precisely such an electrical potential that the space between the electrode and the object is free of fields. The compensation can be performed by raising the potential at the measuring electrode to the voltage to be determined of the object. For the measurement, in particular no knowledge of the distance or the coupling capacity between the electrode and the object is required. Complex determination of the distance or of a dielectric strength can be dispensed with. Nevertheless, the nature of the measurement is very reliable and highly accurate. Only very low powers are required for the application of the voltages required for the compensation at the electrode. A technical embodiment is simple to implement. Direct contact with the object to be measured is not necessary. Thus, only minimum levels of interference or intervention in the measurement object take place. The apparatus also enables the determination of the potential of even an object which is only very difficult to access.

Preferably, the potentiometer is designed to determine a change over time in an electrical state of charge of the electrode and to change the reference potential depending on the determined state of charge in such a way that, when the end value is reached, the change over time in the state of charge disappears. The change over time in the electrical state of charge can be determined in particular by measurement of a charge-reversal current, which flows between the electrode and a reference potential carrier. In the case of freedom from fields between the object and electrode, a steady state is achieved and no charge-reversal currents flow anymore. The measurement of the charge-reversal current therefore enables meaningful conclusions to be drawn on the electrical field between the electrode and the object and the compensation case can be identified very easily. If, for example, the charge-reversal current is zero, the voltage present at the electrode now only needs to be measured or read and the electrical potential of the object is determined.

Preferably, the device comprises an amplifier comprising a first input and a second input as well as an output, wherein the electrode is electrically connected to the first input, and the potentiometer is electrically connected to the second input, and the first input is electrically connected to the output. In this way, an expedient measurement arrangement which can be realized easily and in uncomplicated fashion is provided, by which the reference potential of the electrode can be adjusted very easily. In particular reliable measurements of the electrical potential of the object are possible.

Preferably, the potentiometer comprises a closed-loop control device, which is designed to measure the potential at the output and to adjust the reference potential at the second input depending on the measured potential in such a way that the value of the potential measured at the output is reduced with respect to its absolute value to the value zero. The value of the potential at the output can be measured in particular as voltage with respect to ground. By virtue of the closed-loop control device, it is possible to track the respectively prevailing value for the reference potential in such a way that the reference potential is increased to the potential value of the object. In this way, a reliable and very quick measurement method is provided since the end value is reached quickly.

The field stop can in particular be in the form of a shutter and/or an impellor (chopper). One reliable possibility involves determining DC potentials of an object. Preferably, the change in the reference potential present at the electrode then takes place markedly more quickly than corresponds to the change in the electrical field shielding by virtue of the field stop. The measurement frequency is therefore in particular much greater than the rotational frequency of an impellor.

Preferably, the field stop is then electrically connected to the second input. Since in this case the field stop has in particular the same reference potential as the electrode, particularly effective freedom from fields is provided, with the result that a meaningful background is provided as reference in order to correctly determine the electrical potential of the object.

Preferably, the electrode is surrounded by an electric field meter and/or a capacitive voltage divider.

A current probe according to the inventors' proposals is used for the contactless determination of an electrical current flowing through the object and comprises the proposed device and an evaluation unit, which is designed to determine an electrical power from a value, determined by the current probe, for the electrical current and a value, determined by the device, for the electrical potential. A current probe known from the related art for contactless current measurement is supplemented in this way by the function of a contactless voltage measurement. This results in a particular synergistic effect since, with the aid of the provided evaluation unit, the electrical power can now also be determined in a contactless fashion from the value for the electrical current which is determined in contactless fashion and the value for the electrical potential which is determined in contactless fashion. In this case, precise knowledge of the coupling of the current probe to the measurement object is not required either for the current measurement or for the voltage measurement. A device for completely contactless power measurement is provided.

The inventors also propose a method for the contactless determination of an electrical potential of an object and comprises the following:

providing an electrode, which is spaced apart from the object;

connecting the electrode to a reference potential;

changing the reference potential to an end value, at which a charge-reversal current flowing between the electrode and a reference potential carrier disappears;

determining the electrical potential of the object by measuring the end value;

periodically changing an arrangement of a field stop, which is arranged between the object and the electrode, so that, at first times, an electrical field is formed between the electrode and the object and, at second times, the electrical field is shielded by the field stop; and determining a temporally constant electrical potential of the object.

Preferably, the electrical potential of the object is temporally variable and can in this case be characterized by a first rate of change. Then, preferably, the reference potential is changed to the end value at a second rate, which is greater than the first rate. In the case of an object through which an alternating current flows, the electrical potential at the object also changes over time. It is then advantageous if closed-loop control is provided, by which the reference voltage at the electrode is tracked sufficiently quickly for compensation of the electrical field and keeps pace with the AC potential at the object. In this case, measurement errors are kept particularly low.

The preferred embodiments illustrated with reference to the device and the advantages of said embodiments apply correspondingly to the current probe and the method.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1A:
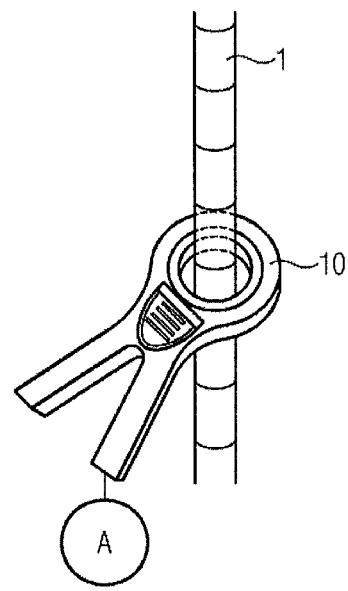
FIG. 1A shows a current probe in accordance with the related art.
Figure 1B:
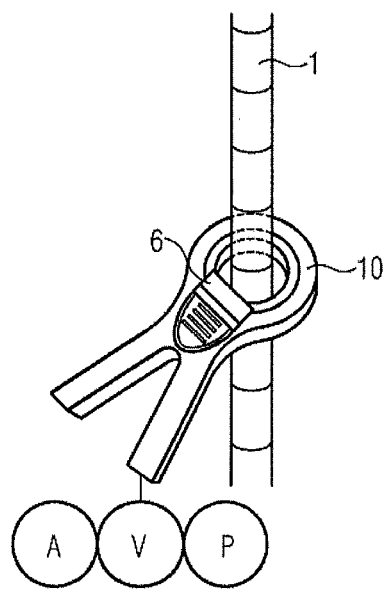
FIG. 1B shows a current probe in accordance with an exemplary embodiment of the proposed devices.

Reference will now be made in detail to the preferred embodiments of the present invention, examples of which are illustrated in the accompanying drawings, wherein like reference numerals refer to like elements throughout.

Identical or functionally identical elements have been provided with the same reference symbols in the figures.

FIG. 1A shows a current probe 10 for contactless current measurement on a line 1 through which a current is flowing. For this purpose, the current probe 10 is laid around the line 1, but does not touch the line. The "A" illustrated in a circle indicates that exclusively a current measurement is possible with the current probe 10 in accordance with the related art.

In contrast, a current probe 10 in accordance with an exemplary embodiment, the inventors' proposals provide the possibility of also implementing contactless voltage measurement and therefore power measurement in addition to the current measurement. This is indicated by the letters "V" and "P" illustrated in circles. For this, a voltage measuring device 6 is provided in the current probe 10; the voltage measuring device will be explained in more detail below.

Figure 2:
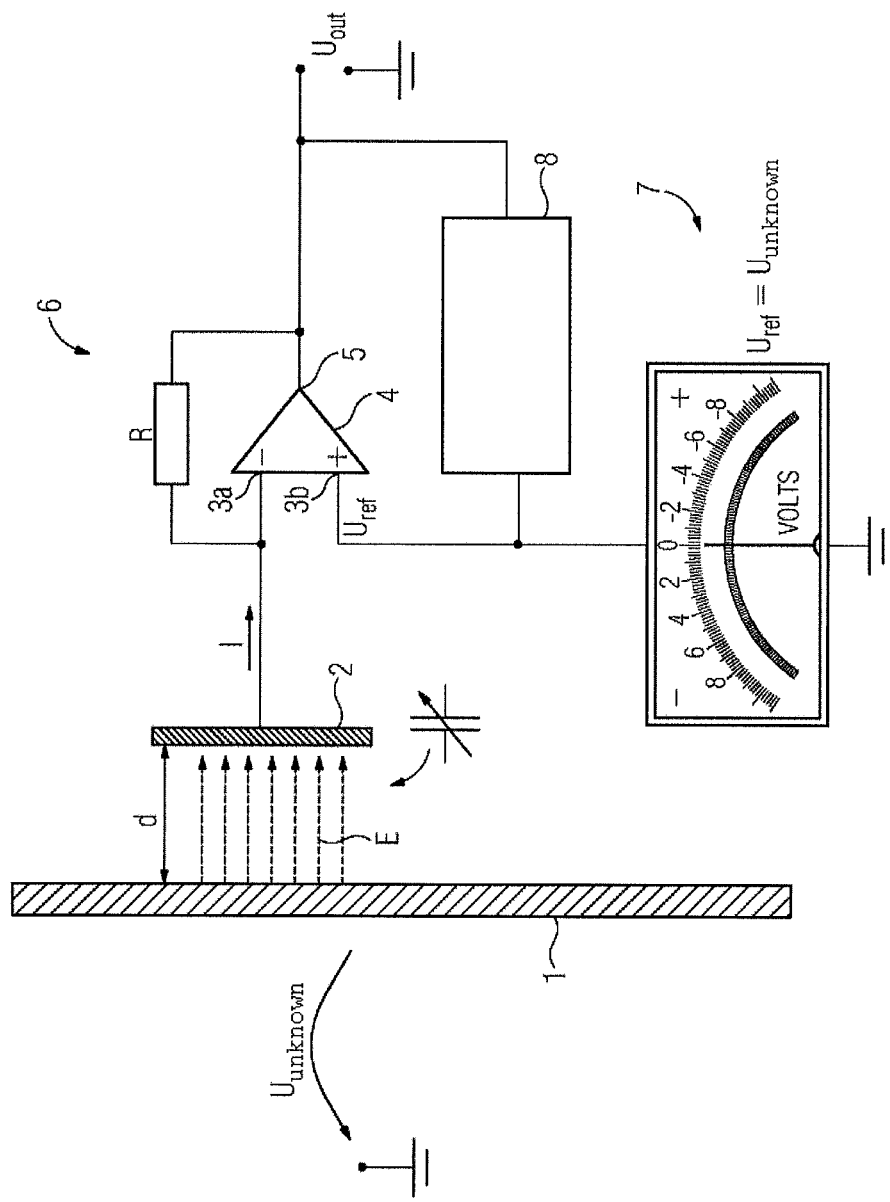
FIG. 2 shows a schematic illustration of a device for determining an unknown potential by compensation of an electrical field.

FIG. 2 shows a line 1, which represents an object whose electrical potential $U_{unknown}$ is intended to be determined. For this, a measuring electrode 2 is positioned at a distance d from the line 1. It should be emphasized that the distance d is unknown. The measuring electrode 2 is connected to an amplifier 4 via a first input 3a. A reference voltage $U_{ref}$ is present at a second input 3b of the amplifier 4, said reference voltage being provided by a potentiometer 7. The potentiometer 7 is in addition electrically connected to an output 5 of the amplifier 4. This output 5 is additionally electrically connected to the first input 3a via an electrical resistor R. This ensures that the reference voltage $U_{ref}$ is also present at the measuring electrode 2. Finally, a mechanism determines an output voltage $U_{out}$ which is present between the output 5 and ground. The potentiometer 7 finally also comprises a controller 8; the operation of said controller will be explained in more detail below.

At the simplest approximation, the capacitor arrangement formed by the line 1 and the measuring electrodes 2 can be described as a plate capacitor with an electrical field E prevailing between the plates. The capacitance of this plate capacitor would be C; the area of the measuring electrode 2 would be A; and the dielectric constant of the medium between the line 1 and the measuring electrode 2 would be ∈. ΔU is the potential difference between the measuring electrode 2 and the line 1. Then, the following physical relationships apply:

$$C = \frac{\varepsilon \cdot A}{d}$$

$$\Delta U = U_{unknown} - U_{ref}$$

$$E = \frac{\Delta U}{d}$$

$$I = C \frac{d(\Delta U)}{dt}$$

$$U_{out} = -R \cdot I = -RC \cdot \frac{d(\Delta U)}{dt}$$

Herein, I is a charge-reversal current which flows between the measuring electrode 2 and the amplifier 4.

The measurement principle now involves the controller 8 raising the reference potential $U_{ref}$ to such an extent that it corresponds to the potential $U_{unknown}$ to be measured. For this, provision can be made for the controller 8 to readjust the reference voltage $U_{ref}$ to the output voltage $U_{out}=0$. That is to say that if the situation is reached in which the output voltage $U_{out}$ disappears, i.e. the value becomes zero, then the reference voltage $U_{ref}$ precisely corresponds to the potential $U_{unknown}$. The reference voltage $U_{ref}$ can then be measured, wherein the measured value precisely corresponds to the potential value $U_{unknown}$. However, even without measurement it may be known which reference voltage $U_{ref}$ has been set at the potentiometer 7, with the result that it is possible to draw a conclusion in respect of the potential $U_{unknown}$ on the basis of this knowledge.

Alternatively, however, provision can also be made for the charge-reversal current I to be detected in the controller 8 and for the reference voltage $U_{ref}$ to be readjusted until the charge-reversal current I disappears, i.e. reaches the valve zero.

This measurement concept is based on the knowledge that, given identical voltages on the line 1 and at the measuring electrode 2 (i.e. $U_{unknown}=U_{ref}$), the electrical field E between the measurement electrode 2 and the line 1 just disappears. The measurement operation therefore involves compensation of the voltage $U_{unknown}$ to be measured at the measuring electrode 2 (for example an electric field meter or a capacitive voltage divider). Thus, a voltage measurement, i.e. a measurement of $U_{unknown}$, is possible even without precise knowledge of the physical arrangement of the measurement electrode 2. Thus, temporary and retrospective installations without making contact with the live line 1 are possible.

In the exemplary embodiment in FIG. 2, $U_{unknown}$ is an AC voltage. As a result of the effect of electrostatic induction, therefore, an AC charge-reversal current I likewise results in the measuring electrode 2. The closed-loop control by the controller 8 then needs to be markedly quicker than the highest frequency components to be measured of the voltage $U_{unknown}$ to be measured in order to be able to correctly track the voltage $U_{ref}$.

Figure 3:
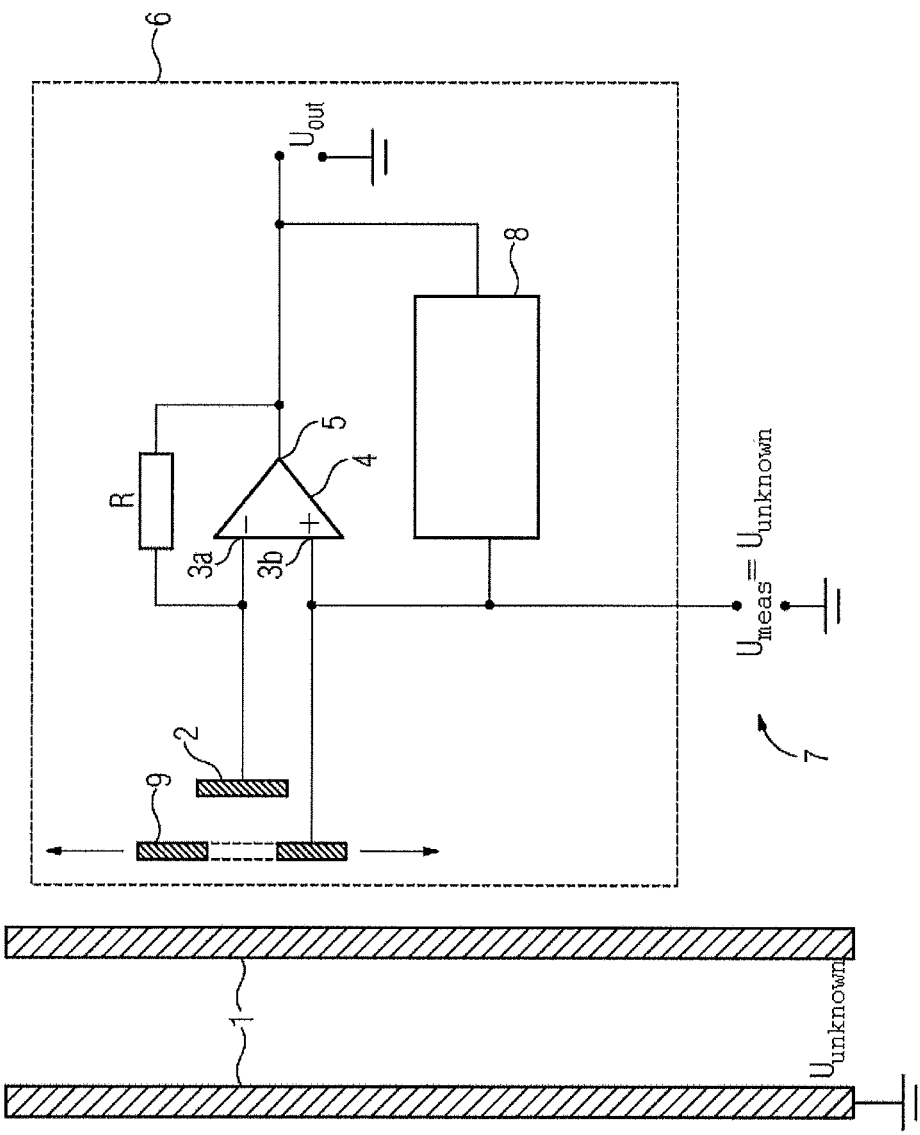
FIG. 3 shows an arrangement corresponding to that in FIG. 2, but with a field stop for determining a DC voltage.

FIG. 3 shows a further exemplary embodiment, in which substantially the arrangement in FIG. 2 is implemented, but supplemented by a movably formed field stop 9. The field stop 9 is arranged between the measuring electrode 2 and the line 1, which is at a time-constant potential $U_{unknown}$. The movable field stop is realized by the blades of an impeller of a so-called chopper in the exemplary embodiment. These blades are connected to the second input 3b and are subsequently likewise connected to the reference voltage $U_{ref}$. If a blade is located between the measuring electrode 2 and the line 1, the electrical field E is shielded from the measuring electrode, irrespectively of the value of the potential $U_{unknown}$, and therefore a measurement background or a reference situation for the measurement operation is provided. If, on the other hand, the impeller is set such that a gap is cleared between the measuring electrode 2 and the line 1, the electrical field E is no longer shielded and a measurement can take place as described in connection with FIG. 2. In this way, it is possible to use the described method for the measurement of DC voltages $U_{unknown}$ as well. The control frequency of the controller 8 should then be higher than the frequency of the chopper or the field stop 9. As indicated by the measurement voltage $U_{meas}$, in the exemplary embodiment in FIG. 3 the respectively set reference voltage $U_{ref}$ is measured explicitly: $U_{meas}=U_{ref}$.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A device for contactless determination of an electrical potential of an object, comprising:
    an electrode spaced apart from the object, the electrode being connected to a reference potential, wherein the electrode is surrounded by an electric field meter;
    a potentiometer electrically connected to the electrode to change the reference potential present at the electrode to an end value, at which a charge-reversal current flowing between the electrode and a reference potential carrier disappears, and to determine the electrical potential of the object from the end value;
    a movable device for periodically arranging a field stop between the object and the electrode, so that, at first times, an electrical field is formed between the electrode and the object and, at second times, the electrical field is shielded by the field stop, wherein the potentiometer determines a temporally constant electrical potential of the object; and
    an amplifier, said amplifier comprising a first input, a second input and an output,
    wherein the electrode is electrically connected to the first input of the amplifier, the potentiometer is electrically connected to the second input of the amplifier, and the first input of the amplifier is electrically connected to the output of the amplifier,
    wherein the field stop is electrically connected directly to both the second input of the amplifier and to the reference potential.

2. The device as claimed in claim 1, wherein
    the potentiometer determines, on the basis of the charge-reversal current, a change over time in an electrical state of charge of the electrode, and
    the potentiometer changes the reference potential depending on the state of charge such that, when the end value is reached, the change over time in the state of charge disappears.

3. The device as claimed in claim 2, wherein the potentiometer comprises a closed-loop control device to measure an output potential at the output, and the control device adjusts the reference potential at the second input depending on the output potential so that an absolute value of the output potential is reduced to zero.

4. The device as claimed in claim 3, wherein the field stop is electrically connected to the second input.

5. The device as claimed in claim 4, wherein the electrode is further surrounded by a capacitive voltage divider.

6. The device as claimed in claim 1, wherein
    the potentiometer comprises a closed-loop control device to measure an output potential at the output, and
    the control device adjusts the reference potential at the second input depending on the output potential so that an absolute value of the output potential is reduced to zero.

7. A current probe comprising:
    a device for contactless determination of an electrical potential of an object, comprising:
    an electrode spaced apart from the object, the electrode being connected to a reference potential, wherein the electrode is surrounded by an electric field meter;
    a potentiometer electrically connected to the electrode to change the reference potential present at the electrode to an end value, at which a charge-reversal current flowing between the electrode and a reference potential carrier disappears, and to determine the electrical potential of the object from the end value;
    a movable device for periodically arranging a field stop between the object and the electrode, so that, at first times, an electrical field is formed between the electrode and the object and, at second times, the electrical field is shielded by the field stop, wherein the potentiometer determines a temporally constant electrical potential of the object;
    an amplifier, said amplifier comprising a first input, a second input and an output,
    wherein the electrode is electrically connected to the first input of the amplifier, the potentiometer is electrically connected to the second input of the amplifier, and the first input of the amplifier is electrically connected to the output of the amplifier, wherein the field stop is electrically connected directly to both the second input of the amplifier and to the reference potential; and
    an evaluation unit to determine an electrical power from the electrical current flowing through the object and the electrical potential of the object.

8. A method for contactless determination of an electrical potential of an object, comprising:
    providing an electrode spaced apart from the object, wherein the electrode is surrounded by an electric field meter;

connecting the electrode to a reference potential;
changing the reference potential to an end value, at which a charge-reversal current flowing between the electrode and a reference potential carrier disappears;
determining the electrical potential of the object by measuring the end value;
periodically arranging a field stop between the object and the electrode, so that, at first times, an electrical field is formed between the electrode and the object and, at second times, the electrical field is shielded by the field stop; and
providing an amplifier connected to the electrode, said amplifier having a first input, a second input and an output;
electrically connecting the electrode to the first input of the amplifier, electrically connecting the potentiometer to the second input of the amplifier, and electrically connecting the first input of the amplifier to the output of the amplifier;
electrically connecting the field stop directly to both the second input of the amplifier and to the reference potential; and
determining a temporally constant electrical potential of the object.

9. The method as claimed in claim 8, wherein the electrical potential of the object is temporally variable at a first rate of change, and
the reference potential is changed to the end value at a second rate of change, which is greater than the first rate.

* * * * *